United States Patent
Chu et al.

(10) Patent No.: US 7,368,953 B2
(45) Date of Patent: May 6, 2008

(54) BUFFER

(75) Inventors: Shin Ho Chu, Icheon-shi (KR); Sun Mo An, Icheon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 30 days.

(21) Appl. No.: 11/275,462

(22) Filed: Jan. 6, 2006

(65) Prior Publication Data

US 2007/0080719 A1  Apr. 12, 2007

(30) Foreign Application Priority Data

Oct. 6, 2005  (KR) .................... 10-2005-0094052

(51) Int. Cl.
  *G11C 7/00* (2006.01)
  *H03K 19/00* (2006.01)
(52) U.S. Cl. .................... 326/93; 326/95; 327/295; 365/222
(58) Field of Classification Search ............... 326/93, 326/95; 327/108, 263, 291, 295; 365/222, 365/233
See application file for complete search history.

(56) References Cited

U.S. PATENT DOCUMENTS

| 6,426,661 | B1 | 7/2002 | Curran |
| 6,657,462 | B2 | 12/2003 | Dobberpuhl |
| 6,909,314 | B2* | 6/2005 | Ahn .................... 327/202 |
| 7,154,319 | B2* | 12/2006 | Kim .................... 327/218 |

FOREIGN PATENT DOCUMENTS

| KP | 10-2003-0038265 | 5/2003 |
| KP | 10-2004-0100249 | 12/2004 |

* cited by examiner

*Primary Examiner*—Daniel Chang
(74) *Attorney, Agent, or Firm*—Marshall, Gerstein & Borun LLP

(57) ABSTRACT

A buffer is disclosed. The buffer may include a buffer controller for buffering a refresh signal enabled in an auto-refresh operation synchronously with an external clock signal, a logic circuit for performing a logic operation with respect to an output signal from the buffer controller and a specific signal to output a control signal, and an internal clock generator controlled by the control signal from the logic circuit for buffering the external clock signal and generating internal clock signals.

12 Claims, 3 Drawing Sheets

BUFFER

BRIEF DESCRIPTION OF THE DRAWINGS

Features and advantages of the present invention will be more clearly understood from the following detailed description taken in conjunction with the accompanying drawings, in which.

FIELD OF THE INVENTION AND DESCRIPTION OF THE RELATED ART

This patent invention relates to a buffer, and more particularly to a clock buffer for receiving a refresh signal synchronously with a falling edge of an external clock signal so that it can be stably enabled or disabled in an auto-refresh operation.

In general, a command buffer, a clock enable buffer, a clock buffer, etc. are used in a dynamic random access memory (DRAM). The command buffer is adapted to receive command signals external to a chip, such as a row address strobe signal rasb, a column address strobe signal cas, a write enable signal web and a chip select signal csb, and generate internal command signals. The clock enable buffer is adapted to receive a clock enable signal ckeb external to the chip and generate an internal clock enable signal. The clock buffer acts to receive a clock signal external to the chip and generate an internal clock signal.

For reduction in current consumption, these buffers are disabled in an auto-refresh operation, namely, in a period from the input of an auto-refresh command until the input of the next auto-refresh command. However, conventionally, a clock enable signal ckeb or refresh signal Ref input is inputted directly to the buffers in the auto-refresh operation to enable or disable the buffers, thus causing unstable operations of the buffers in the auto-refresh operation.

Such an unstable operation of a conventional clock buffer in the auto-refresh operation will hereinafter be described in detail with reference to FIG. 1, which is a circuit diagram of the conventional clock buffer.

Figure 1:
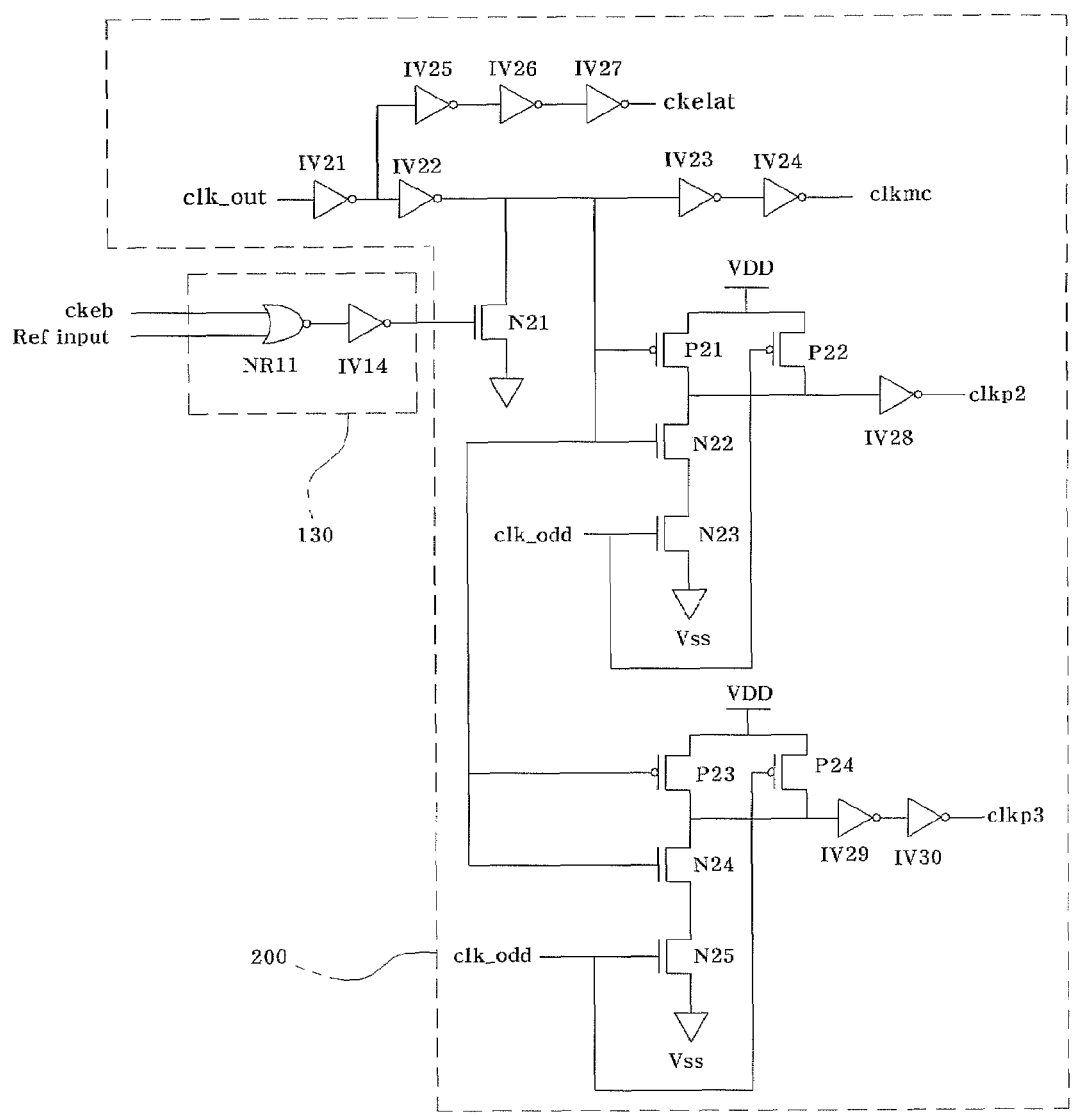
FIG. 1 is a circuit diagram showing the configuration of a conventional clock buffer.

The conventional clock buffer comprises, as shown in FIG. 1, a logic circuit 130 including a NOR gate NR11 for performing a logic operation with respect to a refresh signal Ref input and a clock enable signal ckeb, and an inverter IV14 for buffering an output signal from the NOR gate NR11, and an internal clock generator 200 controlled by an output signal from the logic circuit 130 for buffering an external clock signal clk_out and generating internal clock signals clkp2 and clkp3.

A detailed description will hereinafter be given of the operation of the conventional clock buffer with the above-mentioned configuration in the auto-refresh operation.

First, the refresh signal Ref input and the clock enable signal ckeb remain low in level before an auto-refresh command is inputted. As a result, the output signal from the logic circuit 130 becomes low in level by an OR operation, thereby causing an NMOS transistor N21 to be turned off. Consequently, in the clock buffer, a buffering circuit including PMOS transistors P21 and P23 and NMOS transistors N22 and N24, and inverters IV28, IV29 and IV30 cooperate to buffer the external clock signal clk_out to output the internal clock signals clkp2 and clkp3.

Thereafter, when the auto-refresh command is inputted, the refresh signal Ref input goes from low to high in level. Also, the clock enable signal ckeb goes from low to high in level after the auto-refresh command is inputted. As a result, the output signal from the logic circuit 130 becomes high in level and the NMOS transistor N21 is thus turned on, thereby causing a ground voltage Vss to be applied to the gates of the PMOS transistors P21 and P23 to turn on the PMOS transistors P21 and P23. Consequently, a high level, or VDD level, is outputted through the PMOS transistors P21 and P23, so the internal clock signal clkp2 becomes low in level and the internal clock signal clkp3 becomes high in level. In this manner, for reduction in current consumption, the clock buffer is enabled before the auto-refresh command is inputted, and disabled in the auto-refresh operation.

However, the refresh signal Ref input and the clock enable signal ckeb are inputted directly as control signals to the conventional clock buffer in the auto-refresh operation to enable or disable the clock buffer, thus causing instability in the operation of the clock buffer in the auto-refresh operation.

In detail, at the time that the auto-refresh command is inputted while the clock buffer is enabled to generate the internal clock signals clkp2 and clkp3, the enabled refresh signal Ref input and clock enable signal ckeb are inputted to the clock buffer at once to disable the clock buffer. At this time, the clock buffer may be disabled before all signal components corresponding to a pulse width of the external clock signal are inputted, and the internal clock signals may thus be generated on the basis of only the partially inputted external clock signal components.

The internal clock signals, generated by buffering the partially inputted external clock signal components, have narrower pulse widths than those of the normally generated internal clock signals, thereby making it impossible to accurately recognize command signals inputted synchronously therewith.

Structure of the Invention

A clock buffer receives a refresh signal synchronously with a falling edge of an external clock signal so that it can be stably enabled or disabled in an auto-refresh operation.

A buffer may include a buffer controller for buffering a refresh signal synchronously with an external clock signal, the refresh signal being enabled in an auto-refresh operation; a logic circuit for performing a logic operation with respect to an output signal from the buffer controller and a specific signal to output a control signal; and an internal clock generator controlled by the control signal from the logic circuit for buffering the external clock signal and generating internal clock signals.

Preferably, the buffer further comprises a latch circuit connected between the buffer controller and the logic circuit for latching the output signal from the buffer controller.

Preferably, the latch circuit includes: a first inverter for inverting/buffering the output signal from the buffer controller; and a second inverter connected with the first inverter in latch form.

The second inverter may be operated synchronously with the external clock signal when the buffer controller is turned off.

The buffer controller may be operated synchronously with a falling edge of the external clock signal.

The buffer controller may perform an inverting operation.

The specific signal may be a clock enable signal.

The logic circuit may perform an OR operation with respect to an output signal from the latch circuit and the clock enable signal.

Reference will now be made in detail to the preferred embodiments of the present invention, examples of which are illustrated in the accompanying drawings, wherein like reference numerals refer to like elements throughout. The embodiments are described below to explain the present invention by referring to the figures.

Figure 2:
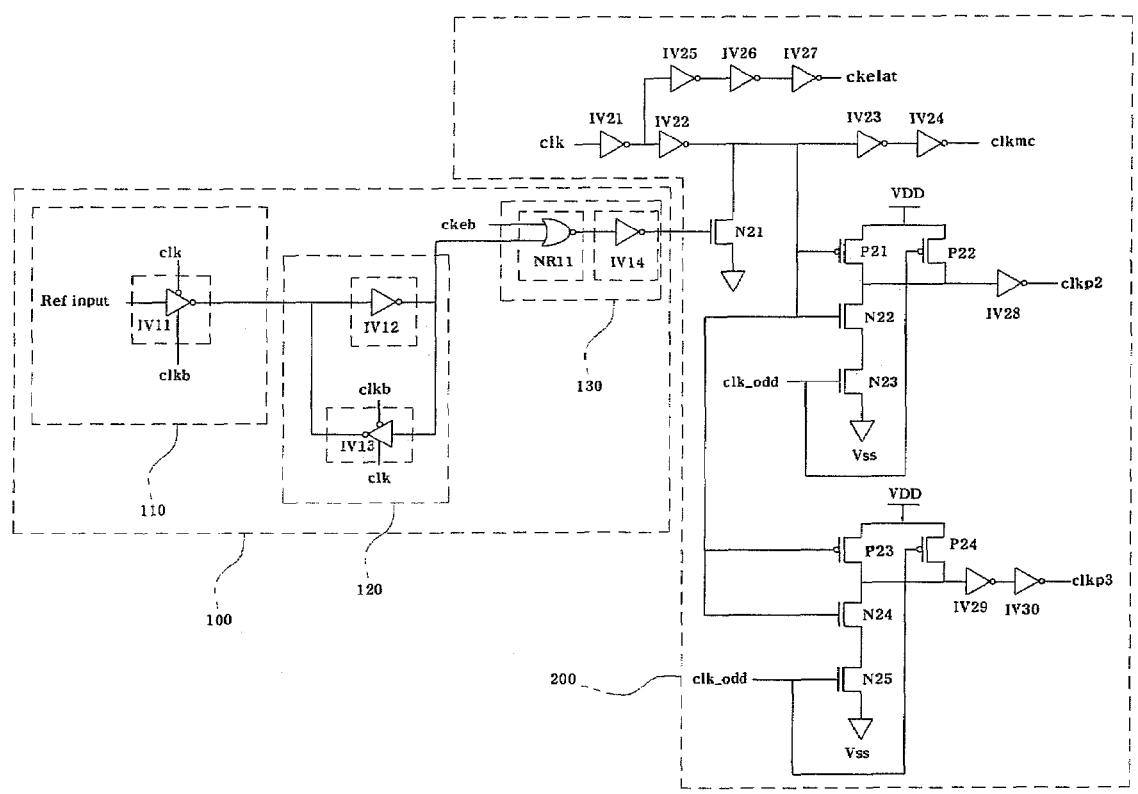
FIG. 2 is a circuit diagram showing the configuration of a clock buffer according to an exemplary embodiment of the present invention.

FIG. 2 is a circuit diagram showing the configuration of a clock buffer according to an exemplary embodiment of the present invention.

As shown in FIG. 2, the clock buffer according to this embodiment comprises a control signal generator 100 including a buffer controller 110 for buffering a refresh signal Ref input enabled in an auto-refresh operation synchronously with an external clock signal elk, and a logic circuit 130 for performing a logic operation with respect to an output signal from the buffer controller 110 and a clock enable signal ckeb to output a control signal. The clock buffer according to the present embodiment further comprises an internal clock generator 200 controlled by the control signal from the logic circuit 130 for buffering the external clock signal clk and generating internal clock signals clkp2 and clkp3.

The buffer controller 110 is operated synchronously with a falling edge of the external clock signal clk, and is composed of an inverter IV11 for performing an inverting operation.

The control signal generator 100 further includes a latch circuit 120 connected between the buffer controller 110 and the logic circuit 130 for latching the output signal from the buffer controller 110. The latch circuit 120 includes a first inverter IV12 for inverting/buffering the output signal from the buffer controller 110, and a second inverter IV13 connected with the first inverter IV12 in latch form. The second inverter IV13 is operated synchronously with the external clock signal when the inverter IV11 of the buffer controller 110 is turned off.

As stated above, the internal clock generator 200 is controlled by the control signal from the logic circuit 130 to buffer the external clock signal clk and generate the internal clock signals clkp2 and clkp3.

The operation of the clock buffer with the above-stated configuration according to the present embodiment will hereinafter be described with reference to FIG. 2.

First, the refresh signal Ref input which is enabled in the auto-refresh operation is inverted and outputted by the inverter IV11 of the buffer controller 110. In detail, when the refresh signal Ref input is high in level, the output signal from the buffer controller 110 assumes a low level. Notably, the inverter IV11 of the buffer controller 110 is operated synchronously with the external clock signal clk, more particularly only when the external clock signal clk is low in level. When the inverter IV11 of the buffer controller 110 is operated, it functions to invert and buffer the inputted refresh signal Ref input. The reason for receiving the refresh signal Ref input synchronously with the falling edge of the external clock signal clk is to prevent the clock buffer from being disabled when the external clock signal clk is high in level, such that the generated internal clock signals clkp2 and clkp3 do not have narrow pulse widths resulting from partially inputted signal components of the external clock signal clk.

Next, the signal inverted and outputted by the buffer controller 110 is again inverted and buffered by the first inverter IV12 of the latch circuit 120. As a result, the output signal from the latch circuit 120 is the same as the refresh signal Ref input. Here, the second inverter IV13 is connected with the first inverter IV12 in latch form, and is operated when the external clock signal clk is high in level. Thus, when the inverter IV11 receiving the refresh signal Ref input is turned off, the second inverter IV13 is turned on to prevent floating of the input signal.

The output signal from the latch circuit 120 is inputted to the logic circuit 130, which then performs an OR operation with respect to the output signal from the latch circuit 120 and the clock enable signal ckeb to generate the control signal. This control signal assumes a high level when both the clock enable signal ckeb and refresh signal Ref input are high in level, and a low level, otherwise. In more detail, because both the clock enable signal ckeb and refresh signal Ref input are high in level in the auto-refresh operation, the control signal from the logic circuit 130 assumes a high level.

Figure 3:
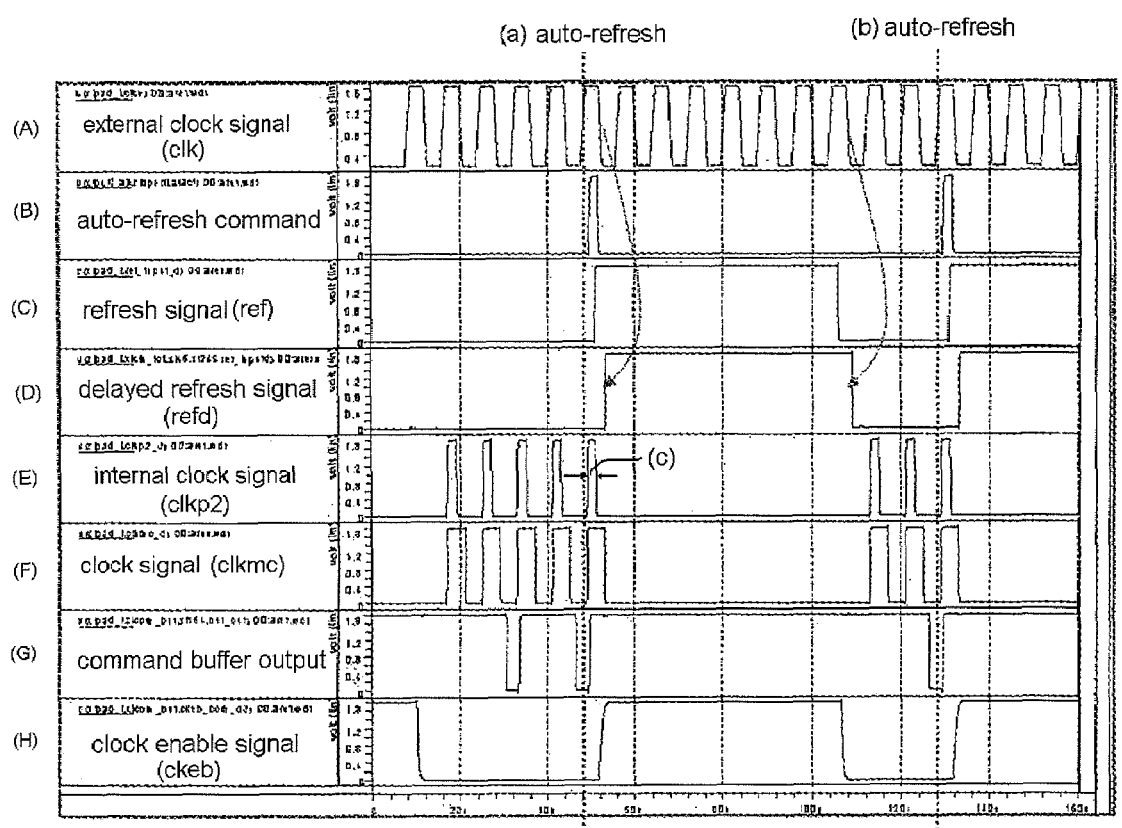
FIG. 3 is a timing diagram illustrating the operation of the clock buffer according to the embodiment of the present invention.

The control signal from the logic circuit 130 is inputted to the internal clock generator 200 to control the internal clock generator 200, which receives the external clock signal clk and outputs the internal clock signals clkp2 and clkp3. This control operation will hereinafter be described in detail with reference to FIG. 3.

First, the refresh signal ref, C and the clock enable signal ckeb, H remain low in level before an auto-refresh command a is inputted. As a result, the output signal from the logic circuit 130 becomes low in level by an OR operation, thereby causing an NMOS transistor N21 to be turned off. Consequently, the clock buffer outputs the internal clock signals clkp2 and clkp3 by buffering the external clock signal clk.

Thereafter, when the auto-refresh command a is inputted, the refresh signal ref, C goes from low to high in level. At this time, the refresh signal ref, C is inputted to the logic circuit 130 via the buffer controller 110 and latch circuit 120 synchronously with the falling edge of the external clock signal clk, A. Hence, a refresh signal refd, D inputted to a NOR gate NR11 of the logic circuit 130 is a signal delayed from the refresh signal ref, C inputted to the buffer controller 110 by a predetermined period. That is, the refresh signal refd, D makes a low to high level transition at the falling edge of the external clock signal clk, A. As stated previously, the reason for receiving the refresh signal refd, D synchronized with the falling edge of the external clock signal clk, A is to prevent the generated internal clock signals clkp2 and clkp3 from having narrow pulse widths resulting from a partially inputted high-level pulse of the external clock signal clk, A, thus preventing misrecognition of a command signal.

Also, the clock enable signal ckeb, H goes from low to high in level after the auto-refresh command a is inputted. As a result, the output signal from the logic circuit 130 becomes high in level and the NMOS transistor N21 is thus turned on, thereby causing a ground voltage Vss to be applied to the gates of PMOS transistors P21 and P23 to turn on the PMOS transistors P21 and P23. Consequently, a high level, or VDD level, is outputted to the outside of the clock buffer through the turned-on PMOS transistors P21 and P23. At this time, the internal clock signal clkp2, E, buffered and outputted by an inverter IV28, assumes a low level.

Thereafter, at the time that the refresh signal ref, C makes a high to low level transition before the next auto-refresh command b is inputted, the refresh signal refd, D inputted to the logic circuit 130 goes low in level synchronously with the falling edge of the external clock signal clk, A, so the output signal from the logic circuit 130 becomes low in level, thereby causing the NMOS transistor N21 to be turned off. Consequently, the clock buffer outputs the internal clock signals clkp2 and clkp3 obtained by buffering the external clock signal clk.

In this manner, the clock buffer according to the present embodiment is disabled, not by the direct input of the refresh signal, but by the input of the refresh signal in synchronization with the falling edge of the external clock signal clk. Therefore, the clock buffer is prevented from being disabled when the external clock signal clk is high in level. This makes it possible to prevent generation of internal clock signals with narrow pulse widths resulting from a partially inputted high-level pulse of the external clock signal clk.

As apparent from the above description, the present invention provides a clock buffer for receiving a refresh signal synchronously with a falling edge of an external clock signal so that it can be stably enabled or disabled in an auto-refresh operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A buffer comprising:
   a buffer controller for buffering a refresh signal synchronously with an external clock signal, the refresh signal being enabled in an auto-refresh operation;
   a logic circuit for performing a logic operation with respect to an output signal from the buffer controller and a specific signal to output a control signal; and
   an internal clock generator controlled by the control signal from the logic circuit for buffering the external clock signal and generating internal clock signals.

2. The buffer as set forth in claim 1, further comprising a latch circuit connected between the buffer controller and the logic circuit for latching the output signal from the buffer controller.

3. The buffer as set forth in claim 2, wherein the latch circuit includes:
   a first inverter for inverting/buffering the output signal from the buffer controller; and
   a second inverter connected with the first inverter in latch form.

4. The buffer as set forth in claim 3, wherein the second inverter is operated synchronously with the external clock signal when the buffer controller is turned off.

5. The buffer as set forth in claim 1, wherein the buffer controller is operated synchronously with a falling edge of the external clock signal.

6. The buffer as set forth in claim 1, wherein the buffer controller performs an inverting operation.

7. The buffer as set forth in claim 1, wherein the specific signal is a clock enable signal.

8. The buffer as set forth in claim 7, wherein the logic circuit performs an OR operation with respect to an output signal from the latch circuit and the clock enable signal.

9. The buffer as set forth in claim 2, wherein the buffer controller is operated synchronously with a falling edge of the external clock signal.

10. The buffer as set forth in claim 2, wherein the buffer controller performs an inverting operation.

11. The buffer as set forth in claim 2, wherein the specific signal is a clock enable signal.

12. The buffer as set forth in claim 10, wherein the logic circuit performs an OR operation with respect to an output signal from the latch circuit and the clock enable signal.

* * * * *